United States Patent
Lichtenstein et al.

(10) Patent No.: US 7,085,299 B2
(45) Date of Patent: Aug. 1, 2006

(54) HIGH POWER SEMICONDUCTOR LASER WITH A LARGE OPTICAL SUPERLATTICE WAVEGUIDE

(75) Inventors: Norbert Lichtenstein, Adliswil/Zurich (CH); Arnaud Christian Fily, Zurich (CH); Bertoit Reid, Orleans (CA)

(73) Assignee: Bookham Technology plc, Towcester (GB)

( * ) Notice: Subject to any disclaimer, the term of this patent is extended or adjusted under 35 U.S.C. 154(b) by 143 days.

(21) Appl. No.: 10/800,546

(22) Filed: Mar. 15, 2004

(65) Prior Publication Data
US 2004/0208213 A1 Oct. 21, 2004

(30) Foreign Application Priority Data
Mar. 19, 2003 (GB) ................. 0306279.1

(51) Int. Cl.
*H01S 3/04* (2006.01)
(52) U.S. Cl. ................ 372/43.01; 372/45.011; 372/45.012
(58) Field of Classification Search ......... 372/43.01, 372/45.011, 45.012, 102; 385/131
See application file for complete search history.

(56) References Cited
U.S. PATENT DOCUMENTS

| | | | |
|---|---|---|---|
| 4,731,789 A | * | 3/1988 | Thornton ............... 372/45.012 |
| 4,750,183 A | | 6/1988 | Takahashi et al. ............ 372/45 |
| 5,732,179 A | * | 3/1998 | Caneau et al. ............... 385/131 |
| 6,714,569 B1 | * | 3/2004 | Zhu et al. ...................... 372/22 |

FOREIGN PATENT DOCUMENTS

| | | |
|---|---|---|
| EP | 0 661 784 A2 | 12/1994 |
| JP | 61194790 | 8/1986 |
| JP | 6292388 | 10/1994 |
| JP | 7170017 | 7/1995 |
| JP | 2000196201 | 7/2000 |

OTHER PUBLICATIONS

GB Search Report dated Sep. 8, 2003 for corresponding GB Application No. GB0306279.1.
U.S. Appl. No. 11/001,736 filed Dec. 2, 2004.

* cited by examiner

*Primary Examiner*—Tuyet Vo
*Assistant Examiner*—Jimmy Vu
(74) *Attorney, Agent, or Firm*—Renner, Otto, Boisselle & Sklar, LLP

(57) ABSTRACT

The invention relates to high power semiconductor diode lasers of the type commonly used in opto-electronics, mostly as so-called pump lasers for fiber amplifiers in the field of optical communication, e.g. for an erbium-doped fiber amplifier (EDFA) or a Raman amplifier. Such a laser, having a single cavity and working in single transverse mode, is improved by placing a multilayer large optical superlattice structure (LOSL) into at least one of the provided cladding layers. This LOSL provides for a significantly improved shape of the exit beam allowing an efficient high power coupling into the fiber of an opto-electronic network.

27 Claims, 5 Drawing Sheets

HIGH POWER SEMICONDUCTOR LASER WITH A LARGE OPTICAL SUPERLATTICE WAVEGUIDE

FIELD OF THE INVENTION

The invention relates to high power semiconductor diode lasers of the type commonly used in opto-electronics, mostly as so-called pump lasers for fiber amplifiers in the field of optical communication, e.g. for an erbium-doped fiber amplifier (EDFA) or a Raman amplifier. Such lasers usually have a single cavity and work in single lateral and vertical mode. They provide a narrow-bandwidth optical radiation with a high power output in a given frequency band. In particular, the invention relates to such a laser working at wavelengths of more than 1100 nm.

BACKGROUND AND PRIOR ART

Semiconductor lasers of the type mentioned above have, for example, become important components in the technology of optical communication, particularly because such lasers can be used for amplifying optical signals immediately by optical means. This allows to design all-optical fiber communication systems, avoiding any complicated conversion of the signals to be transmitted which improves speed as well as reliability within such systems.

In one kind of optical fiber communication systems, the lasers are used for pumping erbium-doped fiber amplifiers, so-called EDFAs, which have been described in various patents and publications known to a person skilled in the art. Examples of technical significance are three main types, typically used for erbium amplifiers, corresponding to the absorption wavelengths of erbium: strained quantum-well InGaAs lasers are used at 980 nm; GaAlAs lasers at 820 nm, and InGaAsP and multiquantum-well InGaAs lasers at 1480 nm. The present invention is especially directed towards the latter type of lasers, i.e. lasers for wavelengths of more than 1100 nm and may for example be implemented in InGaAsP, multiquantum-well InGaAs lasers, or AlGaInAs/InP at 1480 nm.

To achieve the desired results with such laser diodes, a low vertical farfield of the laser's exit beam is considered advantageous, associated with a large vertical extension of the nearfield to obtain low optical power density in the laser as well as enhanced coupling efficiency for fiber coupling. In addition, low internal losses are essential for efficient high power operation. However, it is not an easy task to achieve this for the group of lasers here addressed.

Here, some remarks on the technical realization of such laser diodes seem appropriate. Persons skilled in the art distinguish between the optical nearfield, i.e. the optical mode in the laser cavity, and the optical farfield, i.e. the mode outside the laser. The lateral dimension of the nearfield is determined by the lateral structure of the laser diode. This is done to avoid laser operation in higher order modes. The lateral dimension is usually several micrometers, typically between 2 to 5 micrometers. Due to the difficult realization of efficient laser structures with large vertical optical nearfields, the dimension in the vertical direction typically is much smaller, usually below 1 micrometer, often in the range of tenths of micrometers.

Since the vertical dimension of the nearfield is much smaller than the lateral dimension, the corresponding farfields have large vertical farfield angles, while their lateral angles typically are much smaller. This is a consequence of the diffraction of the beam when exiting the laser cavity. As a result, in waveguide lasers of the type discussed here, the nearfield generally has the shape of a horizontally extending ellipse, whereas the farfield has the shape of a vertically extending ellipse. This situation is based on a horizontally located laser as shown in FIG. 1.

Optical fibers, the other essential component of fiber networks, generally have a circular cross section which unfortunately does not match the elliptic cross section of the farfield. Significant efforts have been made to avoid the losses occurring by this mismatch, because finally the power coupled into the fiber—and not the "raw" power of the laser diode—determines the performance of a fiber network. One of these efforts is to improve the coupling between the laser's farfield and the fiber. Shaping the form of the farfield thus appears to be a particulary promising approach.

To match the cross section of the optical fiber, a reduction in the vertical farfield is beneficial. This can be achieved by realizing a large vertical nearfield. Such a large vertical extension of the elliptic optical nearfield can be obtained by weakly guiding the optical mode in the vertical direction. To obtain a high efficiency especially for long cavities which are essential for good heat removal, it is necessary that the laser structure has low internal optical losses. For InP-based material systems it is known that the main contribution to optical losses arises from free carrier absorption predominantly in the p-type doped regions. Therefore, the mode is preferably guided in the n-doped part of the laser structure in an asymmetric waveguide arrangement.

To guide the mode in a large waveguide, a small contrast between the indices of refraction of the waveguide layer and the surrounding (cladding) layers is required. In InP based materials, it is beneficial to choose cladding layers made of InP due to the improved electrical and heat conduction of binary alloys compared to ternary or quaternary alloys. To obtain a small contrast for the index of the waveguide to the cladding layers, a relatively low index quaternary material is required. This is characterized by the photoluminescence wavelength ($\lambda$PL) which needs to be below approximately 1000 nm (1.0 µm).

A drawing of such a structure is shown in FIG. 1, explained further below. It is known that the composition of thick layers of these materials is difficult to control. Lack of control easily leads to distortions of the resulting mode profile, degrading the performance of the laser diodes and significantly reducing the yield of the manufacturing process. Therefore, the low index waveguide is made of a set of materials which allow an easier control, like for example InP and a material with a $\lambda$PL of 1100 nm (1.10 µm) or larger, usually referred to as Q1.10 material. The required average index of refraction for the waveguide can now easily be obtained by appropriate variation of the thickness of a pair of InP and Q1.10 material layers.

Another problem associated with weakly guided modes in waveguides having a large extension is that these waveguides are potentially multimode guides, i.e. allow for the generation and guiding of higher order modes. With the solution according to the present invention, it is possible to shape the mode profile for the zero order and higher order modes using an arbitrarily graded index profile enabling discrimination of the higher order modes in potentially multi-mode vertical waveguides.

A third problem is associated with weakly guided modes in asymmetric waveguides. Asymmetric waveguides are advantageous since most of the intensity of the mode is guided in the n-doped part of the section where free-carrier absorption is less dominant. Often asymmetric waveguides are realized taking benefit of an additional small waveguide embedded in the n-cladding of the laser structure nearby the active waveguide. While increasing the size of the mode in such an asymmetric waveguide, these waveguides tend to be unstable against changes in the index of refraction (e.g. due to heating or change in carrier density) since the additional waveguide needs to become very large and in a significant distance to the active waveguide. Using the approach of the large optical superlattice (LOSL) of the present invention, the mode is guided much more stably since the effect of the additional waveguide is distributed over a large waveguide with an averaged low index contrast to the cladding.

A number of solutions have been tried to solve the problems above. None of these solutions, however, worked satisfactorily. For a better understanding, some of the most relevant solutions tried are described below.

One solution, described by T. Namegaya, R. Katsumi, et al in IEEE Journal of Quantum Electronics, V. 29 No. 6, June 1993, pp 1924–1931 under the title "1.48 μm high-power GaInAsP-InP graded-index separate-confinement-heterostructure multiple-quantum-well laser diodes", uses symmetric small waveguides. These are waveguides with a dimension much smaller than the material wavelength. They loosely guide the mode and can be used to realize large nearfields and hence small farfields. Unfortunately, these waveguides exhibit high optical losses associated with the high free-carrier absorption from the overlap of the mode with the p-doped material. Therefore, in InP based material systems, these lasers typically show low efficiency.

Another known solution uses symmetric large waveguides containing low-index material as described by M. Maiorov et al. in Optical Fiber Communication Conference and Exhibit, 2001. OFC 2001, V. 3, 2001, pp.WC2-1-3 vol. 3, entitled "High power InGaAsP/InP broad-waveguide single-mode ridge-waveguide lasers". These are undoped waveguides with a dimension much larger than the material wavelength; they again loosely guide the mode and can thus be used to realize large nearfields and hence small farfields. Although optical losses in the undoped waveguides are low, these waveguides are not very suitable for the following reasons:

the control of the low index material is difficult;
due to the large undoped regions, additional unwanted voltage drops occur;
for lasers which should run in lateral single mode operation, it is required to etch into the waveguide to obtain sufficiently strong lateral guiding. This leads to both manufacturing problems (since control of etch depth for example in ridge waveguide lasers is difficult) and reliability issues (due to the higher concentration of carriers at the etched surface of the laser).

A further solution are asymmetric waveguides using an additional waveguide as shown in U.S. patent application Ser. No. 10/141,914 by B. Reid et al, assigned to the assignee of the present invention. These devices have an additional waveguide most beneficially placed in the n-part of the laser structure enabling reduced optical losses. The additional waveguide works as a slight disturbance for the mode and is therefor limited to a reduced thickness and a distance from the active waveguide disabling to reach very low farfield angles. At extended size and distance of the additional waveguide, such structures are subject to instabilities leading to degradation of the performance, especially when the index is changed, e.g. due to heating or change in carrier density.

A still further solution tried digital alloys and small electronic superlattices. The idea was that a low average index of refraction can be obtained by alternating layers (most often binary or ternary alloys) with a thickness on the order of the de-Broglie wavelength of the carriers (electrons) in the semiconductor material, resulting in small electronic superlattices. This can also be obtained by alternating the layers on an extremely fine scale, the thickness being in the range of monolayers, i.e. by making a digital alloy as described by A. Ginty et al in "Long wavelength quantum well lasers with InGaAs/InP superlattice optical confinement and barrier layers", Electronics Letters, V. 29, No. 8, 15 April 1993, pp 684–685. Both methods are used to produce an average electron property, i.e. an average bandgap energy. In addition, the first method is typically carried out as a resonant structure providing an additional energy gap for carriers as shown by R. V. Chelakara et al in "Enhancement of potential barrier height by superlattice barriers in the InGaAsP/InP materials system", Electronics Letters, V. 31, No. 4, 16 February 1995, pp 321–323. However, none of the two methods is suitable for the much larger dimensions required for optical guiding. This is due to the large number of interfaces associated with this technique, interfaces potentially lead to reduced electron mobility and distorted morphology. In addition, to achieve the desired growth is difficult since accurate control of the thickness of the layers is required to obtain a required average index of refraction.

Another solution to obtain a large vertical farfield is a spot-size converter as disclosed by M. Wada et al in "Fabrication and coupling-to-fibre characteristics of laser diodes integrated with a spot-size converter having a lateral taper" IEE Proceedings in Optoelectronics, V. 144, No. 2, April 1997, pp 104–108. This solution uses the effect of instabilities associated with the guiding of the vertical mode in asymmetric structures with additional waveguides to suppress the guided mode towards the substrate into a large additional waveguide below the active waveguide. This has to be done adiabatically and requires additional processing or growth steps. In addition, the spot-size converter as part of a laser diode is passive, making such a device less efficient for use as a high power laser diode.

A further solution consists in providing an anti-resonant reflecting optical waveguides (ARROW). Such a solution is described by M. Galarza et al in "Mode-expanded 1.55-/spl mu/m InP-InGaAsP Fabry-Perot lasers using ARROW waveguides for efficient fiber coupling", IEEE Journal on Selected Topics in Quantum Electronics, V. 8, No. 6, November/December 2002, pp 1389–1398, and by A. M. Kubica in "Design of antiresonant reflecting optical waveguides with an arbitrary refractive index profile core layer" at the Lasers and Electro-Optics Society Annual Meeting 1994, LEOS '94 Conference Proceedings. IEEE, V. 2, 31 October-3 November 1994, pp 63–64. Such vertical ARROW structures have been realized in glass as well as in semiconductor materials. In these structures, the relevant layers need to have specific dimensions so that the mode experiences a resonance. These required dimensions restrict the design possibilities and render ARROW structures unusable for many practical purposes. In addition, ARROW structures show in practice only limited performance, mostly due to the fact that the resonance condition needs to be obtained for the whole operating regime while the enhanced, i.e. the "guided", mode is basically a lossy mode.

Generally, a "high slope efficiency" of a laser, i.e. a high radiation output vs. current input, obviously requires low internal losses to reach high output powers before the output power starts to get degraded due to thermal effects caused by heating. On the other hand, efficient heat removal requires a large chip size, which unfortunately reduces the slope efficiency since less light can exit the cavity. Thus, the internal losses of a laser and how to minimize them play not only a dominating role in laser design today, but actually limit the achievable power output. Knowing that, the more important it becomes to use the laser's output most efficiently and avoid any unnecessary losses. Here, a laser according to the invention, by providing a reduced vertical farfield, significantly improves the coupling efficiency between the laser and the fiber and therefor represents an important step forward in laser design.

Thus, it is the main and principal object of the invention to provide a solution to the problems addressed further above and overcome the disadvantages and limitations of the described prior art designs. This is achieved by devising a simple and reliable high power laser structure whose manufacturing is easy and offers a high yield. Such a laser, to be useful especially for pump lasers in optical fiber communication systems, e.g. high power EDFAs and Raman pump laser designs, must provide a stable output and, at the same time, must show leading edge performance.

BRIEF DESCRIPTIONS OF THE INVENTION

The novel high power laser structure according to the invention has a continuous active region comprising a gain region and a waveguide and an optical waveguide in the cladding whose vertical part consists or comprises an optical superlattice, whereby the superlattice itself consists of or includes an arrangement of layers with alternating indices of refraction. This enables a low vertical farfield and reduced optical losses, as needed for high power operation, e.g. as pump sources for Raman amplifiers. The large optical superlattice (LOSL) is designed to produce the desired low vertical farfield by weak vertical guiding of the optical mode which results in a widened nearfield mode. This is due to the low average index of refraction obtained from the individual layers of the large optical superlattice (LOSL).

The provision of a LOSL in the laser structure overcomes the problems associated with the growth of material having a low index of refraction, i.e. close to the value for the cladding layers. This is especially the case for quaternary alloys, e.g. in the material system InP/InGaAsP for quaternary alloys with photoluminescence wavelength significantly smaller than 1100 nm. In this wavelength region, it is well known that good control of the composition is hard to achieve. With the present invention, the individual layers of the LOSL are made of material whose composition is easy to control, and the layers have dimensions in the material-wavelength of the light or smaller, i.e. the wavelength in vacuum divided by the index of refraction of the material. Therefore, an averaging of the optical properties occurs while the electronic properties remain those of the individual layers. Varying the thickness of the individual layers allows an easy adjustment of the LOSL's average index of refraction. It also allows a profile shaping of the guided zero and higher order modes by intentional thickness variations.

Using this technique allows the relative simple fabrication of large optical waveguides with constant, or linearly graded (G-LOSL), or arbitrarily shaped (S-LOSL) index profiles. The LOSL is especially advantageous for structures which support asymmetric guiding of the mode, i.e. where the mode is guided mainly in the n-doped part of the laser structure to reduce free-carrier absorption. This can be achieved by an asymmetric large optical superlattice (A LOSL).

A LOSL according to the invention can also be combined with a grating, e.g. a Bragg grating, for use in a distributed feedback laser (DFB).

BRIEF DESCRIPTION OF THE DRAWINGS

The function and a preferred embodiment of the invention are described below with reference to the drawings. The drawings are provided for illustrative purposes and are not necessarily to scale.

DETAILED DESCRIPTION OF EMBODIMENTS

Figure 1:
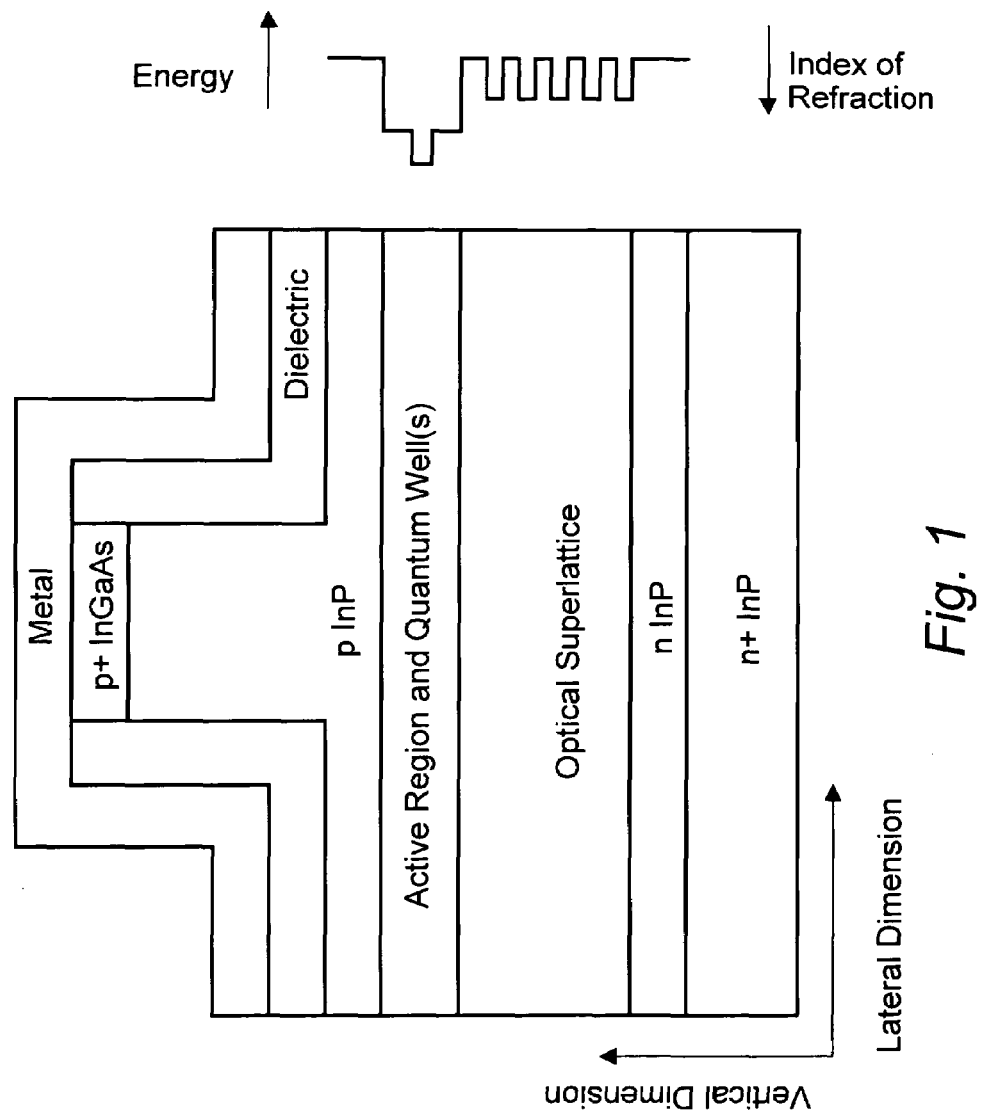
FIG. 1 shows a schematic cross section of a semiconductor laser diode with the various layers, including a superlattice according to the invention.

FIG. 1 shows the basic layout, i.e. the cross section of the essential parts, of a semiconductor laser diode according to the invention, together with the distribution of the associated refraction index on the right. Starting from the bottom of the structure shown in FIG. 1, the n+InP layer represents the InP substrate for the epitaxial growth of the laser structure, followed by an n InP layer, both known from the prior art. On this lower cladding layer, the optical superlattice is located, followed by the laser's active region with a gain region and a waveguide. Preferably the optical superlattice terminates towards the active region with a material with low index of refraction and therefor high bandgap. Most preferably the material with low index of refraction consists of InP. On top of the active region, another cladding layer, here of p InP is situated, forming the laser ridge with a narrow p+InGaAs layer on top of the ridge. The whole structure carries a metallization on top.

Thus, the novel laser design incorporates an active waveguide embedded in p-doped and n-doped cladding layers. The focal point of the present invention is the large optical superlattice (LOSL), located in one of the cladding layers. Though the LOSL in FIG. 1 is shown within the n_InP cladding layer, it can as well form "the end" of the cladding layer, located between the p_InP layer and the active region, i.e. on top of the active region, or on both sides of the active region.

However, it appears that most beneficially the LOSL is arranged asymmetrically, as asymmetric large optical superlattice (A-LOSL) towards the n-side of the structure, thus enabling the mode guiding predominantly in the n-doped layers of the structure where the optical losses are low.

The diagram in FIG. 1, right of the laser, shows the distribution of the refractive index along the laser's cross section, i.e perpendicular to the laser's longitudinal extension, with the higher index depicted as a value more to the left. The orientation of the diagram in FIG. 1 was selected to stay with the given orientation of the laser. Thus, the higher index values extend to the left, this is indicated by the arrow "Index of Refraction". The lower the index, the higher is the energy of the bandgap of the semiconductor material; this is indicated by the arrow on top of the diagram, labeled "Energy".

As indicated in the refractive index diagram of FIG. 1, the large optical superlattice (LOSL) has a structure providing an alternating distribution of the refractive index in the vertical extension of the laser. This is one possible implementation of the core innovative idea of the present invention, leading, in its variations and adjustments, to the above described advantages over the prior art.

Starting from this general principle, i.e. the provision of a large optical superlattice (LOSL) adjacent the active layer of the laser, the possible variations shall now be discussed with reference to the remaining figures.

Figure 2:
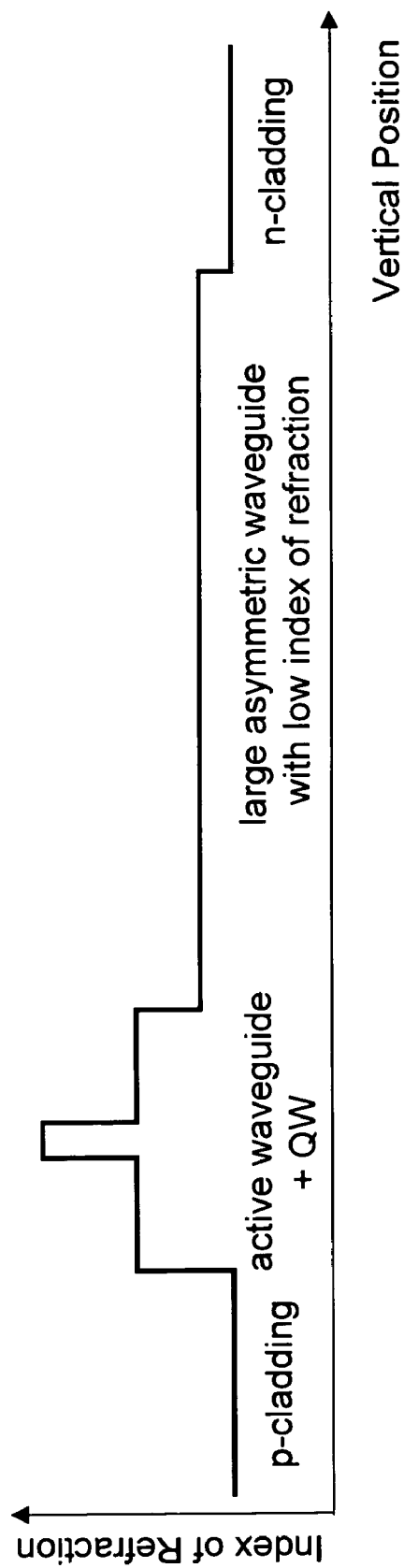
FIG. 2 displays a refraction index distribution of a large asymmetric waveguide with low index material according to the prior art.

FIG. 2 shows—in a diagram similar to the diagram of FIG. 1, but now in horizontal orientation—the distribution of the refractive index across a laser diode as used in the prior art. An n-cladding layer (shown on the right) on a (not shown) substrate is followed by a large asymmetric waveguide with a low index of refraction. Located on the latter is the active region and the quantum well (QW), followed by another cladding layer, usually a p-ladding layer.

As discussed above, the invention replaces the essentially homogeneous waveguide according to the prior art by at least one inhomogeneous waveguide, structured in a particular way, namely as large optical superlattice structure (LOSL) with a defined overall index of refraction.

In brief, this LOSL guides the mode very weakly in the vertical direction and thus enables a large expansion of the mode in the nearfield which in turn leads to a compressed vertical farfield.

The LOSL according to the invention is preferably a multi-layer structure. It may be doped to avoid problems associated with the carrier transport at the interfaces between the individual layers. The thickness of each individual layer is designed to result in a very low averaged index of refraction—preferably close to the index of the cladding layers. The LOSL thus replaces a homogenous material of a low index, which material is difficult to grow, especially for the desired large thickness of the order of several microns.

The thicknesses of the individual layers of the LOSL are chosen such that the guided mode, i.e. the nearfield mode "sees" the average of the optical properties of the LOSL layers, i.e. averages the indices of refraction. The electronic properties however remain those of the individual layers.

Typical thicknesses of the LOSL layers range from 20 nm to 500 nm. The lower limit is given by the onset of quantum effects resulting in undesired effects like resonant reflection of carriers. This corresponds to a lower thickness limit larger than the de-Broglie wavelength in the material which might be smaller or in the range of 20 nm. The upper value is determined by the wavelength of the light in the material where smoothing of the optical properties of the individual layers seen by the nearfield mode starts to be incomplete.

Figure 3:
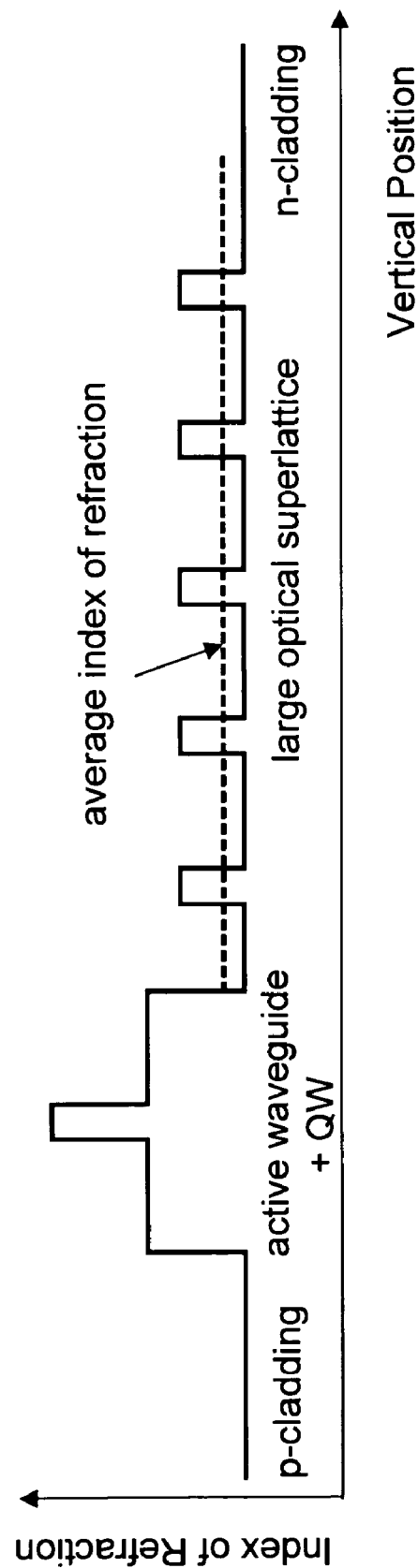
FIG. 3 depicts a first refraction index distribution of a waveguide, here with an asymmetric large optical superlattice (LOSL) according to the invention.

FIG. 3 shows the index of refraction index for a constant, "averaged" design of the LOSL. The refractive index and the thickness are the same for each of the various alternating LOSL layers, resulting in a constant average index of refraction for the whole LOSL structure.

In addition to a more or less homogenous average value of the index of refraction effected by the LOSL described above in FIG. 3, it is also possible to particularly shape the nearfield mode profile for the zero order and higher order modes.

Figure 4:
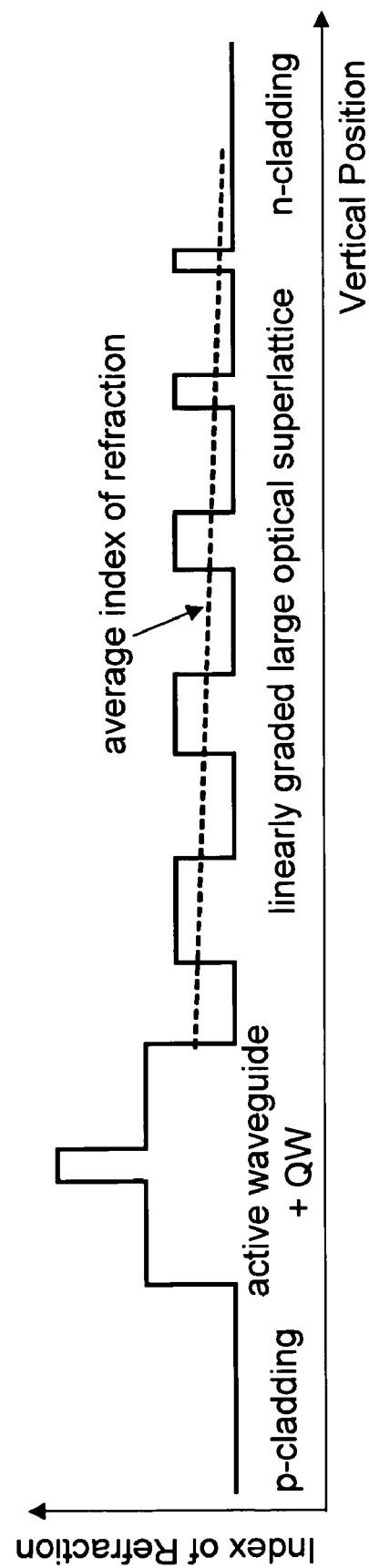
FIG. 4 shows a second refraction index distribution of a waveguide, here with a linearity graded large optical superlattice (G-LOSL) according to the invention.

FIG. 4 shows one possibility of implementing such a LOSL. Using a LOSL structure with one and the same refractive index for each of the layers, but different thicknesses, in particular choosing the thicknesses for one of the layers decreasing from the active region towards the neighboring cladding layer, results in a linearly graded optical superlattice, a G-LOSL. Such a G-LOSL exhibits a refractive index profile so-to-speak gradually terminating from the waveguide towards the cladding layer.

Figure 5:
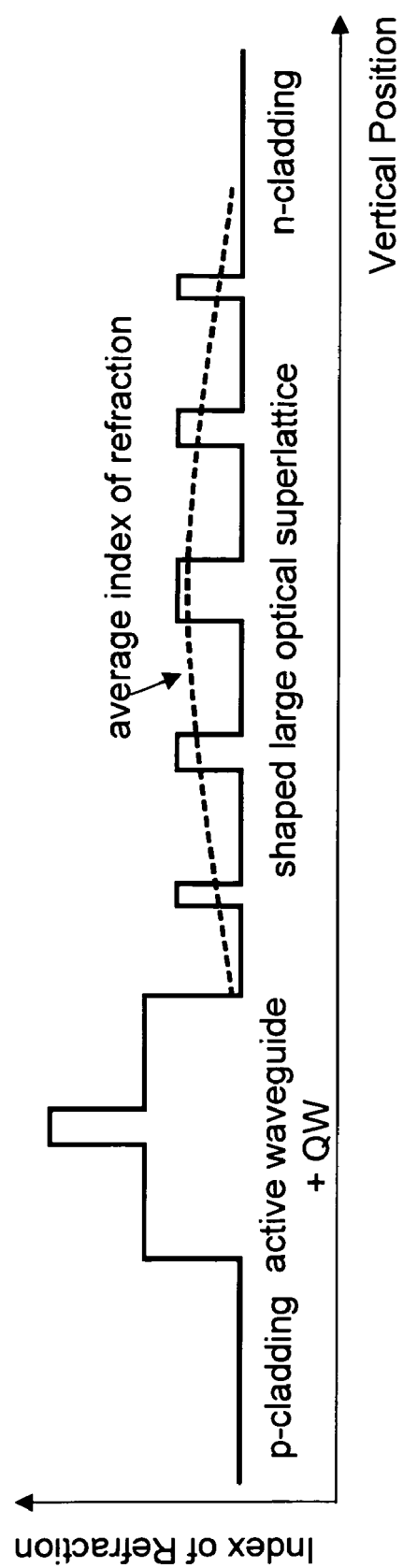
FIG. 5 displays a third refraction index distribution of a waveguide, here with an asymmetrically shaped large optical superlattice (S-LOSL) according to the invention.

FIG. 5 shows another shaped index profile also enabling discrimination of the higher order modes in potentially multimode vertical waveguides. Using a LOSL structure with one and the same refractive index for each of the layers, but with a thickness maximum in the center of the LOSL, results in a shaped optical superlattice, an S-LOSL.

It will be apparent to a person skilled in the art that the discrimination of vertical modes can be further enhanced by choosing and modifying doping levels along the vertical direction of the waveguide together with constant or modified thicknesses of the LOSL layers. Generally one would chose to place high doping levels at those points in the vertical LOSL waveguide where the intensity of the higher order modes is high and where the intensity of the zero order mode is low.

Higher order modes show multiple maximums of intensity whereas the zero order mode only shows a single maximum. Thus the most suitable positions for placing high doping levels for mode discrimination are those positions where the intensity of the higher order mode is high and, at the same time, the overlap of the higher order mode and the zero order mode is minimal. In this case, the higher order mode experiences efficient damping due to the additional losses without sacrificing the low internal losses for the zero order mode.

At present, the most preferred way of embodying the invention is the following.

The LOSL concept in InP-based compounds is realized with an a priori knowledge of the active region of the laser. This determines the laser's emission wavelength and a first approximation of the desired effective index of refraction for the fundamental mode of the device.

Then a pair of materials is chosen for the LOSL, materials that can be grown in the same growth run as the active structure of the laser is made. The best choice consists in having one material with an index of refraction less than the first index approximation mentioned above, and another material with an index of refraction greater than said first approximation.

However, considerations apart from the purely optical ones may limit the possibilities of choice. The feasibility of the epitaxial growth of the materials has to be taken into account. The best choice consists in taking two materials whose lattice parameters equals strictly the lattice parameter of the semiconductor substrate on which all layers are epitaxially grown using one of the known techniques. Obviously, none of the two materials chosen for the LOSL should possess a bandgap energy less than the energy of the photons composing the laser beam. The electrical and thermal properties of the two LOSL materials have to be compatible with the usual properties expected for material used in a high power laser diode. In particular the n-doping level in both materials should be nearly equal to the level of the cladding layers of the laser structure.

For a laser having a 1400 nm to 1550 nm emission wavelength, the most suitable materials are among the so called "InP lattice-matched" InGaAsP quaternaries, having an emission wavelength between 940 nmm and 1300 nm at room temperature and being n-type doped between $1 \times 10^{17}$ cm$^{-3}$ and $5 \times 10^{18}$ cm$^{-3}$.

For a laser having a 1200 nm to 1300 nm wavelength, the best choice of materials is among those "InP lattice-matched" InGaAsP quaternaries having an emission wavelength between 940 nm and 1100 nm at room temperature and being n-type doped between $1\times10^{17}$ $cm^{-3}$ and $5\times10^{18}$ $cm^{-3}$ again.

Ideally one of the two materials is InP itself because of its superior quality in series resistance, carrier confining properties, and good thermal conductivity.

The chosen total thickness of the LOSL is based on the specific design point desired. For a laser having 1400 nm to 1550 nm wavelength, the total thickness of the LOSL preferably ranges between 1000 nm and 7000 nm.

The chosen total number of alternations between the two LOSL depends on the limitations imposed by the growth system for the crystal quality in an epilayer with multiple interfaces. In the embodiment describes so far, between 4 and 20 such alternations may be used.

The choice of the LOSL's refractive index profile depends on the complexity of the manufacturing process desired. A constant profile has the big advantage of simple realization, but graded profiles, in particular linear or parabolic profiles as explained above, result in better lasers. Using a graded profile, the locally averaged index of refraction should be higher adjacent the active region of the laser diode and lower at the opposite end, i.e. more distant from the laser cavity, of the LOSL.

The person skilled in the art should have no problem in determining the best choice, depending on the desired functionality of the laser diode. The resulting sequence of alternating layers of the two materials with varying thickness can be calculated using standard algorithms applied on the given material index of refraction values. Attention must be paid to keep each individual thickness of the lower bandgap material above the typical thickness where a quantization of the transverse electron movement occurs, i.e., above the de-Broglie wavelength which might be typically 20 nm or less. Attention should also be paid to choose LOSL layers thinner than typically one optical wavelength, i.e. less than about 500 nm.

For a pair of consecutive layers of different materials, the local dilution factor is defined as the thickness of the lower band gap material divided by the sum of the thicknesses of the two layers. For a high laser efficiency and for achieving low vertical beam divergence and/or a low internal loss level, the dilution factor should be between 5% and 30%.

For a LOSL according to FIG. 3, the following materials and dimensions are selected.

The lower index material are layers of InP with a thickness of 430 nm. The higher index material is InGaAsP with a composition according to a wavelength of Q1.10 and a thickness of 70 nm. A total of 10 alternating layers results in a total thickness of the LOSL of 5000 nm. All layers would be n-doped at around $5\times10^{17}$ $cm^{-3}$.

For the functionality of the LOSL, the n-doped InP layer between the InP substrate and the LOSL is uncritical and can be chosen to about 1.5 µm and doped to about $5\times10^{17}$ $cm^{-3}$.

An active region with multiple quantum wells embedded in a thin waveguide region, a p-doped upper cladding layer and an InGaAs contact layer complete the structure. This is essentially known in the art.

Realizing such a laser as a lateral single mode laser diode, for example by realizing a ridge waveguide into the p-doped cladding layer, one would advantageously use a thin etch-stop layer of InGaAsP at the desired position in the p-cladding.

With such a laser structure realized as a ridge waveguide laser diode, one obtains in excess of 1 W at 20° C. under continues wave operation. Lateral and vertical farfield patterns amount to 7° and 13.8° full width at half maximum (FWHM), respectively. The emission is single mode in both lateral and vertical direction for all drive currents. This is a significant improvement over prior art approaches which result in power levels around 400–700 mW with vertical farfields as large as 25° FWHM, or even 40°. Due to the low internal losses, slope efficiencies in excess of 0.45 W/A for 3.6 mm long laser devices have been obtained with lasers according to the present invention. With prior art devices of such a cavity length, efficiencies of only around 0.27 to 0.35 W/A were reached.

In principle, any of the various embodiments described above will look similar or even identical to the schematic structure shown in FIG. 1, and a person skilled in the art should have no problem to determine and vary the technical details, in particular the spatial arrangement. As clearly described, the important aspects of the invention are the unusual selection of various dimensions contrary to the state-of-the-art. These unusual dimensions provide the desired improved function of the present invention.

The invention claimed is:

1. A high power semiconductor laser for generating a laser beam of a given wavelength, said laser comprising:
   an active region comprising a gain region and a waveguide,
   one or more cladding layers, and
   a large optical superlattice structure (LOSL) in one of said cladding layers, said superlattice structure being or comprising at least two superlattice layers differing in their respective refractive indices, each said layer having a thickness larger than the de Broglie wavelength of the electrons in said active region,
   said different refractive indices being effected by different material composition and/or different doping levels and/or different dimensions of said superlattice layers.

2. The laser according to claim 1, wherein
   each said superlattice layer has a thickness of at least 20 nm, preferably between 20 nm and 500nm.

3. The laser according to claim 1, wherein
   the superlattice structure comprises at least two alternatingly stacked superlattice layers which in their totality result in a predetermined overall refractive index of said superlattice structure.

4. The laser according to claim 1, wherein
   the different refractive indices are effected by different thicknesses of the superlattice layers.

5. The laser according to claim 1, wherein
   the at least two superlattice layers have essentially the same thickness.

6. The laser according to claim 1, wherein
   at least two superlattice layers of the same refractive index have essentially the same thickness.

7. The laser according to claim 1, wherein
   the thickness of a superlattice layer is essentially uniform.

8. The laser according to claim 1, wherein
   a plurality of superlattice layers with one of the refractive indices is provided and said superlattice layers vary in their thicknesses.

9. The laser according to claim 8, wherein
   the superlattice layers vary in their thicknesses, vertically decreasing from a maximum thickness close to the active region.

10. The laser according to claim 8, wherein
    the superlattice layers vary in their thicknesses, vertically increasing from a minimum thickness close to the active region.

11. The laser according to claim 8, wherein
the superlattice layers vary vertically in their thicknesses, with a minimum thickness close to the active region, followed by a maximum thickness located centrally, and a minimum thickness located away from said active region.

12. The laser according to claim 8, wherein
the superlattice layers vary vertically in their thicknesses, with a maximum thickness close the active region, followed by a minimum thickness located centrally, and a maximum thickness located away from said active region.

13. The laser according to claim 1, wherein
an InP-based compound or InP is used for at least one of the superlattice layers.

14. The laser according to claim 1, wherein
at least two superlattice layers exhibit approximately the same doping level, preferably n-doping level.

15. The laser according to claim 1, wherein
at least two superlattice layers exhibit different doping levels, preferably n-doping levels, but the dimensions and/or materials of said two superlattice layers are approximately the same.

16. The laser according to claim 1, wherein
at least one superlattice layer exhibits a varying doping level, preferably n-doping levels, namely a high doping level at positions having a high intensity of higher order modes of said laser and having a low overlap of the higher order modes with the zero order mode.

17. The laser according to claim 1, wherein
dimensions and/or materials of the two superlattice layers are approximately the same.

18. The laser according to claim 1, wherein
for a laser having a wavelength of about 1400 nm to 1550 nm, the superlattice layer is chosen from InGaAsP quatemaries having an emission wavelength between 940 nm and 1300 nm and being n-type doped between about $1\times10^{17}$ cm$^{-3}$ and $5\times10^{18}$ cm$^{-3}$.

19. The laser according to claim 1, wherein
for a laser having a wavelength of about 1200 nm to 1300 nm, the superlattice layer is chosen from InGaAsP quatemaries having an emission wavelength between 940 nmm and 1100 nm and being n-type doped between about $1\times10^{17}$ cm$^{-3}$ and $5\times10^{18}$ cm$^{-3}$.

20. The laser according to claim 1, wherein
one of the superlattice layers exhibits a refractive index of at least approximately the same magnitude as one of the cladding layers.

21. The laser according to claim 1, wherein
one of the superlattice layers exhibits lattice parameters at least approximately equal to the lattice parameter of an adjacent cladding layer.

22. The laser according to claim 1, wherein
the superlattice layer adjacent the active region exhibits the lower of the at least two refractive indices.

23. The laser according to claim 1, wherein
the superlattice layer adjacent the active region exhibits a refractive index of the same magnitude as one of the cladding layers.

24. The laser according to claim 1, wherein
one of the superlattice layers consists of the same material as one of the cladding layers, said material preferably being InP.

25. The laser according to claim 1, wherein
the n-doping level of the superlattice layer is at least approximately equal to the n-doping level of an adjacent cladding layer.

26. The laser according to claim 1, wherein
the large optical superlattice structure comprises between 4 and 20 superlattice layers with at least two different refractive indices.

27. The laser according to claim 1, wherein
the total thickness of the optical superlattice structure is between 1000 nm and 7000 nm for a laser emitting at a wavelength between about 1400 nm and 1550 nm.

* * * * *

UNITED STATES PATENT AND TRADEMARK OFFICE
CERTIFICATE OF CORRECTION

PATENT NO. : 7,085,299 B2
APPLICATION NO. : 10/800546
DATED : August 1, 2006
INVENTOR(S) : Norbert Lichtenstein, Arnaud Christian Fily and Benoit Reid It is certified that error appears in the above-identified patent and that said Letters Patent is hereby corrected as shown below:

On The Title Page:
Front Page, Section (75),
 "Bertoit Reid" should be -- Benoit Reid --.

Signed and Sealed this

Tenth Day of October, 2006

JON W. DUDAS
*Director of the United States Patent and Trademark Office*